(12) United States Patent
Furuta

(10) Patent No.: US 11,195,757 B2
(45) Date of Patent: Dec. 7, 2021

(54) WAFER PROCESSING METHOD

(71) Applicant: DISCO CORPORATION, Tokyo (JP)

(72) Inventor: Kenji Furuta, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 57 days.

(21) Appl. No.: 16/790,891

(22) Filed: Feb. 14, 2020

(65) Prior Publication Data

US 2020/0266104 A1    Aug. 20, 2020

(30) Foreign Application Priority Data

Feb. 19, 2019  (JP) .............................. JP2019-027325

(51) Int. Cl.
| | | |
|---|---|---|
| H01L 21/78 | (2006.01) | |
| B23K 26/08 | (2014.01) | |
| H01L 21/67 | (2006.01) | |
| B23K 26/359 | (2014.01) | |
| H01L 21/304 | (2006.01) | |
| B23K 26/36 | (2014.01) | |

(52) U.S. Cl.
CPC .............. *H01L 21/78* (2013.01); *B23K 26/08* (2013.01); *B23K 26/359* (2015.10); *B23K 26/36* (2013.01); *H01L 21/304* (2013.01); *H01L 21/67092* (2013.01)

(58) Field of Classification Search
CPC ................ B23K 26/53; B23K 26/0622; B23K 26/0006; B23K 26/18; B23K 2103/50; B23K 2103/54; B23K 2103/172; B23K 2101/40; B23K 26/702; B23K 26/08
See application file for complete search history.

(56) References Cited

U.S. PATENT DOCUMENTS

2018/0161919 A1*  6/2018  Yamada ................. B23K 26/02

FOREIGN PATENT DOCUMENTS

| JP | 2011049454 A | 3/2011 |
|---|---|---|
| JP | 2013105822 A | 5/2013 |
| JP | 2015037172 A | 2/2015 |
| JP | 2015201529 A | 11/2015 |
| JP | 6481843 A | 2/2019 |

OTHER PUBLICATIONS

Search report issued in counterpart Singapore patent application No. 10202001003P, dated Nov. 3, 2020.

* cited by examiner

*Primary Examiner* — Moazzam Hossain
*Assistant Examiner* — Stanetta D Isaac
(74) *Attorney, Agent, or Firm* — Greer Burns & Crain Ltd.

(57) ABSTRACT

A wafer processing method for processing a wafer with devices formed in regions on a side of a front surface of the wafer, the regions being defined by first scheduled division lines and second scheduled division lines includes a first modified layer forming step and a second modified layer forming step. In the first modified layer forming step, a laser beam is irradiated with its focal point set at a height leveled with a height of a first region located inside the wafer on the side of the front surface of the wafer, whereby first modified layers are formed. In the second modified layer forming step, the laser beam is irradiated with its focal point set at a height leveled with a height of a second region located inside the wafer on a side of a back surface of the wafer, whereby second modified layers are formed.

7 Claims, 6 Drawing Sheets

WAFER PROCESSING METHOD

BACKGROUND OF THE INVENTION

Field of the Invention

The present invention relates to a wafer processing method with devices formed thereon.

Description of the Related Art

In a fabrication step of device chips, a wafer is used with devices such as integrated circuits (ICs) or large scale integrations (LSIs) formed in plural regions, respectively. These plural regions are defined by a plurality of scheduled division lines (streets) and another plurality of scheduled division lines intersecting each other. Plural device chips, which include the devices, respectively, are obtained by dividing the wafer along the individual scheduled division lines.

For the division of the wafer, a cutting apparatus is used, for example. The cutting apparatus includes a spindle (rotary shaft) with ring-shaped cutting blades mounted thereon for cutting the wafer. The cutting blades are rotated and caused to cut into the wafer along the scheduled division lines, whereby the wafer is cut and divided along scheduled division lines.

In recent years, on the other hand, interests are focused on techniques that divide wafers by laser processing. For example, a method has been proposed (refer to, Japanese Patent Laid-Open No. 2011-49454). According to this method, a laser beam that has transmissivity through a wafer is focused inside the wafer to form modified regions (modified layers) along scheduled division lines inside the wafer. The regions with the modified layers formed therein have been made more brittle than the remaining regions in the wafer. When an external force is applied to the wafer having the modified layers formed therein, the wafer is therefore divided along the scheduled division lines from the modified layers as starting points.

To a wafer with modified layers formed therein, a sheet (expandable sheet) that is expandable by application of an external force is bonded, for example. By causing the sheet to expand, an external force is applied to the wafer so that the wafer is divided along the scheduled division lines. A method has also been proposed (refer to, Japanese Patent Laid-Open No. 2015-37172). According to this method, a wafer with modified layers formed therein is subjected to grinding, whereby cracks are created from the modified layers to divide the wafer.

SUMMARY OF THE INVENTION

When dividing a wafer by laser processing as described above, a plurality of modified layers may be formed in a thickness direction of the wafer along individual scheduled division lines depending on the thickness, material and/or the like of the wafer. These plural modified layers are formed, for example, by irradiating a laser beam a plurality of times from a side of an upper surface (a side of a back surface) of the wafer along every single scheduled division line while changing a position (height) of a focal point of the laser beam stepwise in a vertical direction from the side of a lower surface toward the side of the upper surface of the wafer. In this manner, the wafer is appropriately divided from the modified layers as starting points, for example, even if the wafer is relatively thick.

Now, when forming a plurality of modified layers along each of first scheduled division lines and second scheduled division lines intersecting each other, it is common to form plural modified layers from the side of a lower surface to the side of an upper surface of a wafer along the first scheduled division lines and then to form plural modified layers from the side of the lower surface to the side of the upper surface of the wafer along the second scheduled division lines. Upon formation of the modified layers along the second scheduled division lines, the former plural modified layers are hence already formed from the side of the lower surface to the side of the upper surface of the wafer in intersecting regions of the first scheduled division lines and the second scheduled division lines.

Upon formation of the latter modified layers along the second scheduled division lines, the laser beam is also irradiated to the intersecting regions. The laser beam irradiated to the former modified layers already formed in the intersecting regions undergoes diffuse scattering (splashing) so that the laser beam may stray from the second scheduled division lines. As a consequence, the laser beam may also be irradiated onto devices formed on the side of the lower surface (the side of the front surface) of the wafer, leading to potential damage to the devices. Especially when forming the latter modified layers on the side of the lower surface of the wafer along the second scheduled division lines, the laser beam is also irradiated to the multiple former modified layers already formed in the intersecting regions from the lower surface to the upper surface of the wafer. Accordingly, diffuse scattering of the laser beam tends to occur so that the devices are prone to damage.

With the foregoing problem in view, the present invention has as an object thereof the provision of a wafer processing method, which can suppress damage to devices that occurs by irradiation of a laser beam.

In accordance with an aspect of the present invention, there is provided a wafer processing method for processing a wafer with devices formed in regions on a side of a front surface of the wafer. The regions are defined by first scheduled division lines and second scheduled division lines that intersect the first scheduled division lines. The processing method includes a protective member bonding step of bonding a protective member on the side of the front surface of the wafer, a first modified layer forming step of irradiating a laser beam, the laser beam having transmissivity through the wafer, from a side of a back surface of the wafer along the first scheduled division lines and the second scheduled division lines with a focal point of the laser beam being set at a height leveled with a height of a first region located inside the wafer, the wafer being held by a chuck table via the protective member, on the side of the front surface of the wafer, whereby first modified layers are formed in the first region, a second modified layer forming step of, after conducting the first modified layer forming step, irradiating the laser beam from the side of the back surface of the wafer along the first scheduled division lines and the second scheduled division lines with the focal point of the laser beam being set at a height leveled with a height of a second region located inside the wafer on the side of the back surface of the wafer, whereby second modified layers are formed in the second region and cracks are also formed extending from the front surface to the back surface of the wafer to divide the wafer along the first scheduled division lines and the second scheduled division lines, and a grinding step of, after conducting the second modified layer forming step, grinding the wafer on the side of the back surface of the wafer to thin the wafer to a predetermined thickness.

In the first modified layer forming step, cracks may preferably be formed extending from the first modified layers to the front surface of the wafer. Further, in the first modified layer forming step, the first modified layers may preferably be formed so that the front surface of the wafer and the first modified layers have a distance greater than the predetermined thickness therebetween, and, in the grinding step, the wafer may preferably be thinned to the predetermined thickness, whereby the first modified layers are removed.

In the wafer processing method according to the first aspect of the present invention, the first modified layers are first formed in the first region, which is located inside the wafer on the side of the front surface (the side of the lower surface) of the wafer, along the first scheduled division lines and the second scheduled division lines. The second modified layers are then formed in the second region, which is located inside the wafer on the side of the back surface (the side of the upper surface) of the wafer, along the first scheduled division lines and the second scheduled division lines. According to the above-described wafer processing method, no modified layers are yet formed in the second region when forming the first modified layers in the first region along the first scheduled division lines and the second scheduled division lines. Diffuse scattering (splashing) of the laser beam hence hardly occurs in the second region when irradiating the laser beam onto the wafer with the focal point thereof positioned in the first region. As a consequence, the irradiation of the laser beam onto the devices hardly occurs, and therefore the damage to the devices is suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
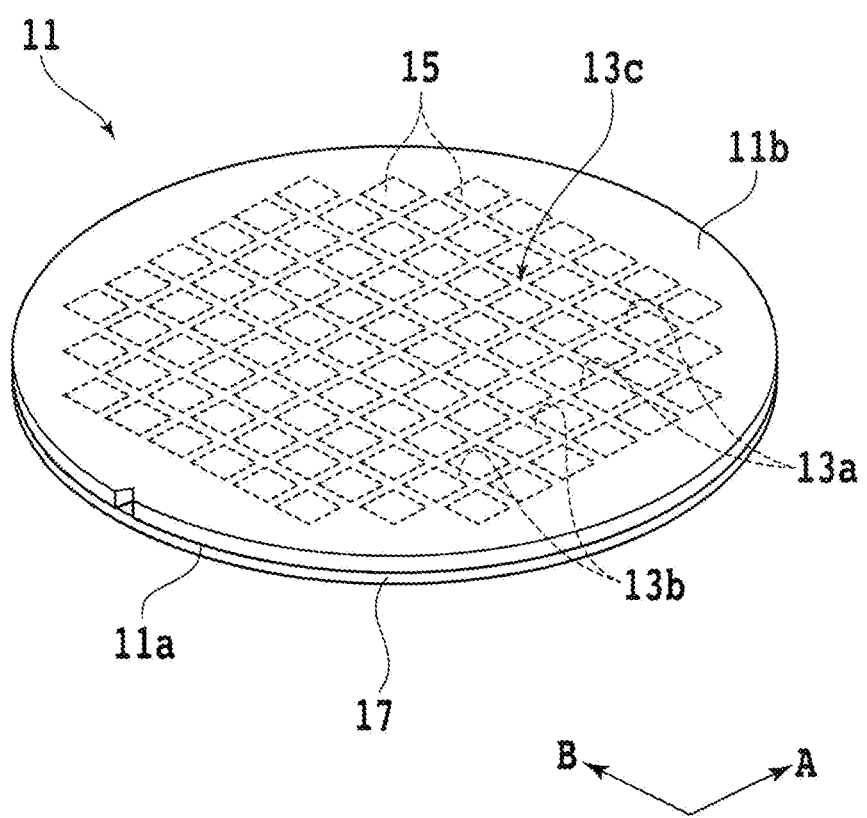
FIG. 1 is a perspective view depicting a wafer.

With reference to the accompanying drawings, an embodiment according to the aspect of the present invention will hereinafter be described. First, a description will be made about a configuration example of a wafer that can be processed by the wafer processing method according to the present embodiment. FIG. 1 is a perspective view depicting a wafer 11.

The wafer 11 is formed in a disk shape by using a material such as, for example, silicon, and has a front surface 11a and a back surface 11b. The wafer 11 is defined into plural regions by a plurality of scheduled division lines (streets) and another plurality of scheduled division lines (streets) arranged in a grid pattern so that they intersect each other. Described specifically, first scheduled division lines 13a and second scheduled division lines 13b are set on the wafer 11. The first scheduled division lines 13a are aligned so that their length directions extend in a first direction (a direction indicated by arrow A), and the second scheduled division lines 13b are aligned so that their length directions extend in a second direction (a direction indicated by arrow B) which is substantially perpendicular to the first direction. The first scheduled division lines 13a and the second scheduled division lines 13b are arranged so as to intersect each other. The wafer 11 is defined into plural regions by the first scheduled division lines 13a and the second scheduled division lines 13b. On a side of the front surface 11a of the wafer 11, devices 15 configured of ICs, LSIs or the like are formed in the respective regions defined by the first scheduled division lines 13a and the second scheduled division lines 13b. When the wafer 11 is divided along the first scheduled division lines 13a and the second scheduled division lines 13b, plural device chips are obtained including the devices 15, respectively.

No limitation is imposed on the material, shape, structure, size and the like of the wafer 11. For example, the wafer 11 may also be formed with a material other than silicon, such as a semiconductor (GaAs, SiC, InP, GaN or the like), sapphire, glass, ceramics, a resin, or a metal. In addition, no limitation is imposed either on the kind, number, shape, structure, size, layout and the like of the devices 15.

Upon dividing the wafer 11, division starting points are formed along the first scheduled division lines 13a and the second scheduled division lines 13b, for example. These division starting points function as starting points for division (triggers for division) upon dividing the wafer 11. The division starting points are formed, for example, by applying laser processing to the wafer 11 and modifying (or affecting) an inside of the wafer 11 along the first scheduled division lines 13a and the second scheduled division lines 13b. Regions modified (modified layers) inside the wafer 11 are made more brittle than the remaining regions of the wafer 11. When an external force that is directed, for example, outward in a radial direction of the wafer 11 is then applied to the wafer 11 with the modified layers formed therein, cracks propagate from the modified layers in the thickness direction of the wafer 11 so that the wafer 11 is divided from the modified layers as starting points. In other words, the modified layers function as division starting points for the wafer 11. As a consequence, the wafer 11 is divided along the first scheduled division lines 13a and the second scheduled division lines 13b, and plural device chips are obtained including the devices 15, respectively.

Upon forming division starting points in the wafer 11 by laser processing, a protective member 17 is first bonded to the side of the front surface 11a of the wafer 11 (protective member bonding step). As the protective member 17, a film-shaped tape made from a resin or the like and formed in a circular shape of substantially the same radius as the wafer 11 is used, for example. The devices 15 formed on the side of the front surface 11a of the wafer 11 are covered and protected by the protective member 17. For the convenience of processing and transfer of the wafer 11, the wafer 11 may be supported by an annular frame. Described specifically, a protective member 17 of a circular shape which has a radius greater than the wafer 11 is bonded to the side of the front surface 11a of the wafer 11, and an annular frame, which includes a circular opening of a radius greater than that of the wafer 11, is bonded to an outer circumferential portion of the protective member 17. As a consequence, a frame unit is configured with the wafer 11 supported by the annular frame via the protective member 17.

Figure 2:
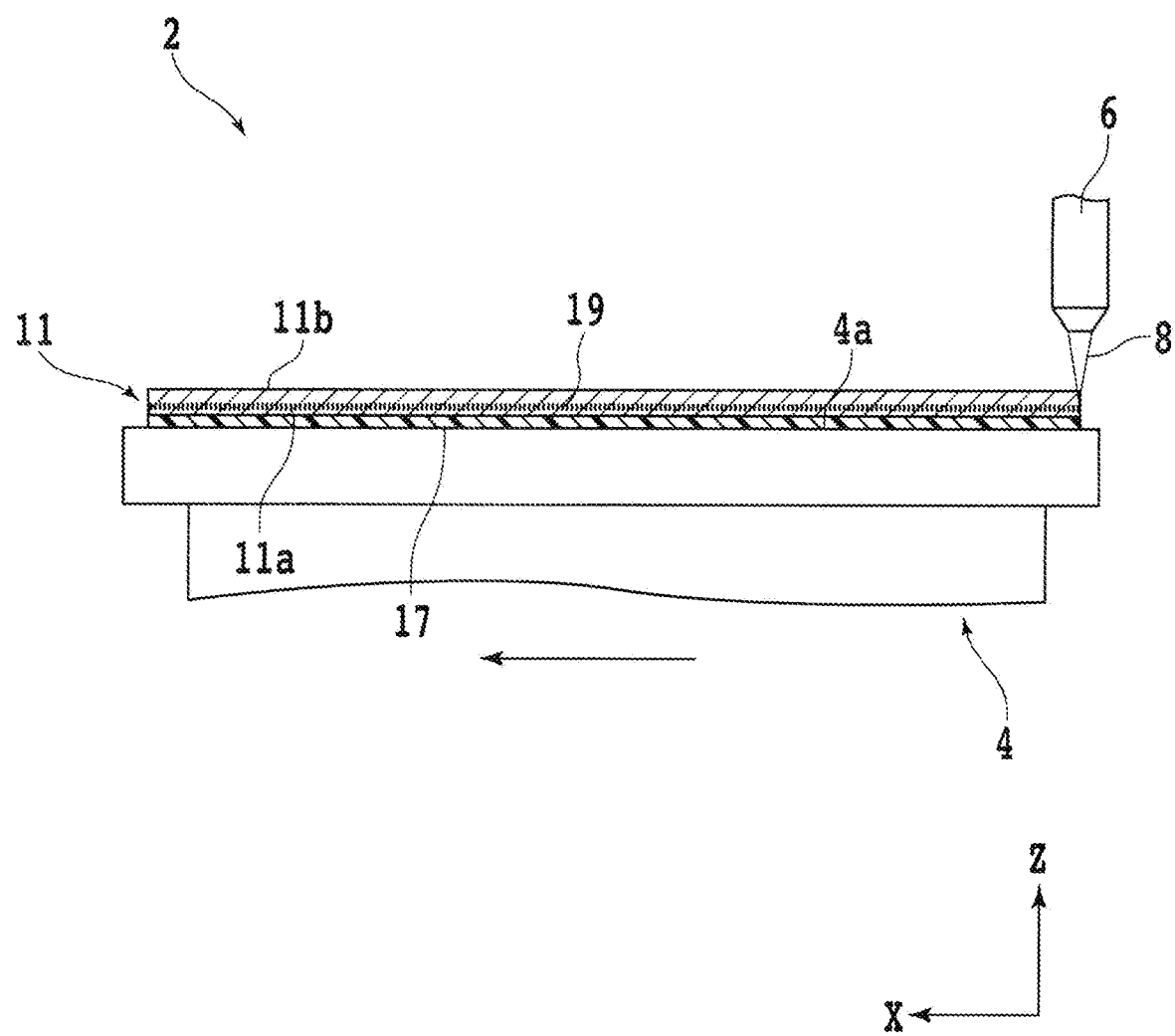
FIG. 2 is a partially cross-sectional side view depicting a laser processing apparatus.

Next, the wafer 11 is held by a laser processing apparatus. FIG. 2 is a partially cross-sectional side view depicting a laser processing apparatus 2. The laser processing apparatus 2 includes a chuck table (holding table) 4 that holds the wafer 11, and a laser irradiation unit 6 that irradiates a laser beam 8.

The chuck table 4 is connected to a rotary drive source (not illustrated) such as an electric motor, and this rotary drive source rotates the chuck table 4 about a rotation axis which is substantially parallel to a vertical direction (Z-axis direction, up-down direction). Further, a moving mechanism (not illustrated) is arranged below the chuck table 4, and this moving mechanism moves the chuck table 4 in a processing feed direction (X-axis direction, first horizontal direction) and in an index feed direction (Y-axis direction, second horizontal direction). The chuck table 4 has an upper surface, which makes up a holding surface 4a that holds the wafer 11. Corresponding to the shape of the wafer 11, the holding surface 4a is formed in a circular shape. However, the shape of the holding surface 4a can be appropriately changed depending on the shape of the wafer 11 or the like. The holding surface 4a is connected to a suction source (not illustrated) via a flow channel (not illustrated) formed inside the chuck table 4.

The laser irradiation unit 6 is arranged above the chuck table 4. The laser irradiation unit 6 includes a laser oscillator that outputs a laser beam of a predetermined wavelength in pulse waveform, and a condenser that focuses the laser beam, which has been outputted from the laser oscillator, at a predetermined position. The laser irradiation unit 6 irradiates the laser beam 8 toward the wafer 11 held by the chuck table 4. The wavelength of the laser beam 8 is set so that the laser beam 8 exhibits transmissivity through the wafer 11. From the laser irradiation unit 6 onto the wafer 11, a laser beam 8 that can transmit through the wafer (has transmissivity through the wafer 11) is irradiated accordingly.

The rotary drive source and moving mechanism, which are connected to the chuck table 4, and the laser irradiation unit 6 are each connected to a control section (not illustrated) configured to control individual elements included in the laser processing apparatus 2. The position of the chuck table 4 and irradiation conditions (the position of the focal point, the power, the spot diameter, the repetition frequency and so on) of the laser beam 8 are controlled by the control section.

The wafer 11 is held by the chuck table 4 via the protective member 17. Described specifically, the wafer 11 is placed on the chuck table 4 so that the side of the front surface 11a of the wafer 11 (the side of the protective member 17) and the holding surface 4a of the chuck table 4 face each other. When a negative pressure of the suction source is applied to the holding surface 4a in this state, the wafer 11 is held under suction by the chuck table 4. The laser beam 8 is next irradiated from the laser irradiation unit 6 toward the wafer 11. At this time, the laser beam 8 is focused inside the wafer 11 (in a region between the front surface 11a and the back surface 11b of the wafer). Further, the irradiation conditions (the power, the spot diameter, the repetition frequency and so on) of the laser beam 8 are adjusted so that the inside of the wafer 11 is modified (affected) through multiphoton absorption. By moving the chuck table 4 in the horizontal direction (the X-axis direction in FIG. 2) while irradiating the laser beam 8 onto the wafer 11, a modified linear layer (affected near layer) 19 (hereinafter simply referred to as "the modified layer (affected layer) 19") is formed inside the wafer 11. The region with the modified layer 19 formed therein is more brittle than the remaining regions of the wafer 11. When an external force is then applied to the wafer 11 with the modified layer 19 formed therein, for example, cracks propagate from the modified layer 19 in the thickness direction of the wafer 11 so that the wafer 11 is divided from the modified layer 19 as starting points. In other words, the modified layer 19 functions as division starting points.

It is to be noted that depending on the thickness, material and/or the like of the wafer 11, a plurality of modified layers 19 may be formed in the thickness direction of the wafer 11. By forming such plural modified layers 19, the wafer 11 can be appropriately divided from the modified layers 19 as starting points even if the wafer 11 is, for example, relatively thick.

When forming such plural modified layers 19 in the thickness direction of the wafer 11, it is common to form plural modified layers 19 between the side of the lower surface (the side of the front surface 11a) and the side of the upper surface (the side of the back surface 11b) of the wafer 11 along the first scheduled division lines 13a (see FIG. 1) and then to form additional plural modified layers 19 between the side of the lower surface to the side of the upper surface of the wafer along the second scheduled division lines 13b (see FIG. 1). Upon formation of the additional modified layers 19 along the second scheduled division lines 13b, the former plural modified layers 19 are hence already formed between the side of the lower surface and the side of the upper surface of the wafer 11 in intersecting regions 13c (see FIG. 1) of the first scheduled division lines 13a and the second scheduled division lines 13b. Upon forming the latter modified layers 19 along the second scheduled division lines 13b, the laser beam 8 is also irradiated to the intersecting regions 13c. Therefore, the laser beam 8 is also irradiated to the former modified layers 19 that are already formed in the intersecting regions 13c. Diffuse scattering (splashing) of the laser beam 8 is thus caused so that the laser beam 8 may stray from the second scheduled division lines 13b. As a result, the laser beam 8 may also be irradiated onto the devices 15 (see FIG. 1) formed on the side of the lower surface (the side of the front surface 11a) of the wafer 11, leading to potential damage to the devices 15. Especially when forming the latter modified layers 19 on the side of the lower surface (the side of the front surface 11a) of the wafer 11 along the second scheduled division lines 13b, the laser beam 8 is also irradiated to the former modified layers 19 already formed in the intersecting regions 13c between the lower surface and the upper surface of the wafer 11. Accordingly, diffuse scattering of the laser beam 8 tends to occur so that the devices 15 are prone to damage.

Therefore, in the wafer processing method according to the present embodiment, two modified layers are first formed in a first region 11c (see FIG. 3A, etc.), which is located inside the wafer 11 on the side of the front surface 11a of the wafer 11, along the first scheduled division lines 13a and the second scheduled division lines 13b, and additional two modified layers are then formed in a second region 11d (see FIG. 4A, etc.), which is located inside the wafer 11 on the side of the back surface 11*b* of the wafer 11, along the first scheduled division lines 13*a* and the second scheduled division lines 13*b*.

Figure 3A:
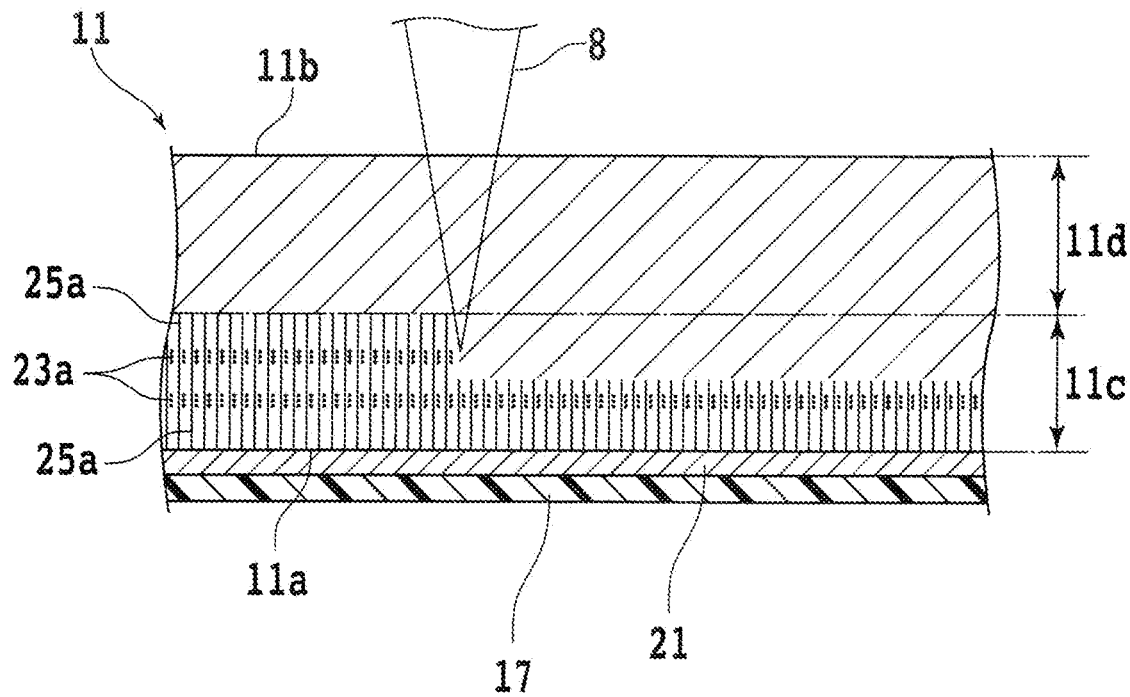
FIG. 3A is a cross-sectional view illustrating on an enlarged scale a portion of the wafer in a first modified layer forming step.

Described specifically, two first modified linear layers (two first affected linear layers) 23*a* (hereinafter simply referred to as "the first modified layers (first affected layers) 23*a*") are first formed in the first region 11*c* of the wafer 11 along the first scheduled division lines 13*a* and the second scheduled division lines 13*b* (first modified layer forming step). FIG. 3A is a cross-sectional view illustrating on an enlarged scale a portion of the wafer 11 in the first modified layer forming step. On the side of the front surface 11*a* of the wafer 11, the protective member 17 is bonded via a device layer (function layer) 21. The device layer 21 corresponds to a layer including various function films (conductive film, insulating film and the like) included in the devices 15 (see FIG. 1) formed on the side of the front surface 11*a* of the wafer 11.

In the first modified layer forming step, the chuck table 4 (see FIG. 2) is first rotated to bring the length direction of one of the first scheduled division lines 13*a* (see FIG. 1) into alignment with the processing feed direction of the chuck table 4. Further, the height of the focal point of the laser beam 8 is leveled with a predetermined first height in the first region 11*c* of the wafer 11. The chuck table 4 is then moved in the processing feed direction while irradiating the laser beam 8 from the laser irradiation unit 6 toward the wafer 11, whereby the laser beam 8 is irradiated along the one first scheduled division line 13*a*. By the irradiation of the laser beam 8, one of the first modified layers 23*a*, which is located on a lower side as seen in FIG. 3A (hereinafter referred to as "the lower first modified layer 23*a*"), is formed at the predetermined first height in the first region 11*c* of the wafer 11 along the one first scheduled division line 13*a*, and further, cracks 25*a* propagate from the lower first modified layer 23*a* in the thickness direction of the wafer 11. It is to be noted that the cracks 25*a* may be formed from the lower first modified layer 23*a* toward one of the front surface 11*a* or the back surface 11*b* or may be formed from the lower first modified layer 23*a* toward both the front surface 11*a* and the back surface 11*b*.

Figure 3B:
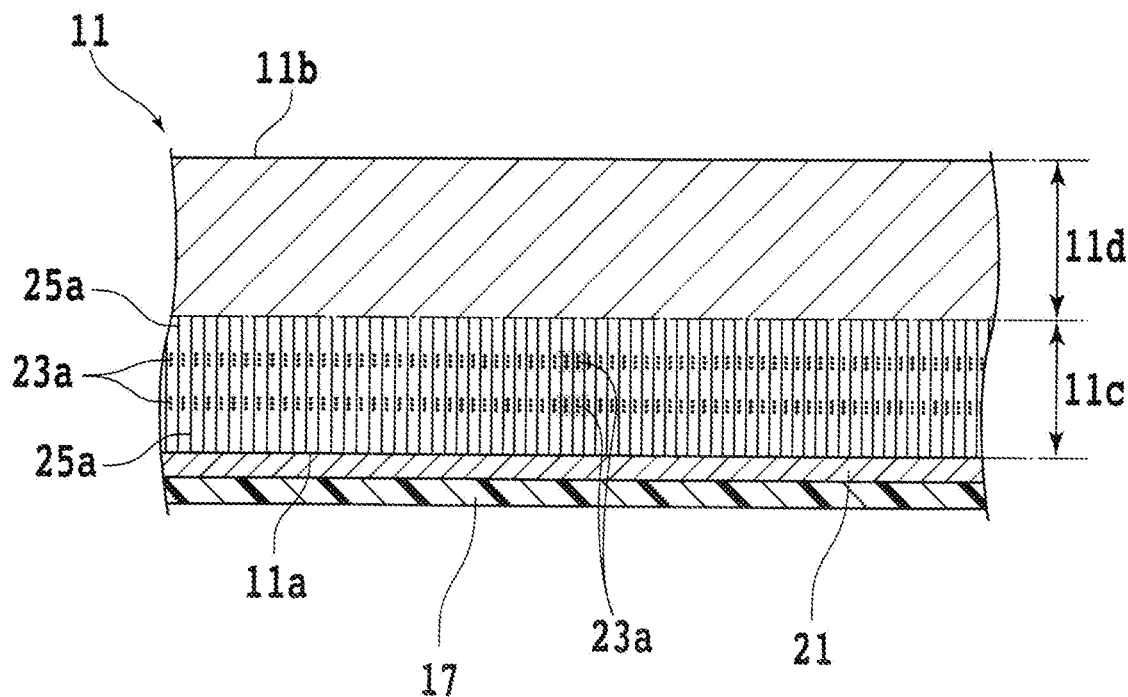
FIG. 3B is a cross-sectional view illustrating on the enlarged scale the portion of the wafer after the first modified layer forming step.

Next, the focal point of the laser beam 8 is moved toward the back surface 11*b* in the first region 11*c* of the wafer 11, and the laser beam 8 is similarly irradiated to the first region 11*c* (see FIG. 3A). As a result, the other first modified layer 23*a* which is located on an upper side as seen in FIGS. 3A and 3B (hereinafter referred to as "the upper first modified layer 23*a*") is formed at a second predetermined height higher than the first predetermined height in the first region 11*c*, whereby the two first modified layers 23*a* which overlap one over the other as seen in a plan view are formed along the one first scheduled division line 13*a*. It is to be noted that an example in which the first modified layers 23*a* are formed as many as two is illustrated in FIG. 3A. However, the number of the first modified layers 23*a* can be changed depending on the thickness, material and/or the like of the wafer 11, and can be set at a desired positive integer of 1 or greater. When plural first modified layers 23*a* are formed, cracks 25*a* propagated from one of the first modified layers 23*a* and cracks 25*a* propagated from one or more remaining first modified layers 23*a* are connected together. In FIG. 3A, the cracks 25*a*, which propagated from the lower first modified layer 23*a* (the first modified layer 23*a* on the side of the front surface 11*a*) toward the side of the back surface 11*b*, and the cracks 25*a*, which propagated from the upper first modified layer 23*a* (the first modified layer 23*a* on the side of the back surface 11*b*) toward the front surface 11*a*, are connected together.

Along the remaining first scheduled division lines 13*a*, additional first modified layers 23*a* are then similarly and successively formed as many as two per every first scheduled division line 13*a*. As a result, the first modified layers 23*a* are formed as many as two in the first region 11*c* of the wafer 11 along every first scheduled division line 13*a*.

Next, the chuck table 4 is rotated to bring the length direction of one of the second scheduled division lines 13*b* (see FIG. 1) into alignment with the processing feed direction of the chuck table 4. Following similar procedures, first modified layers 23*a* are formed as many as two per every second scheduled division line 13*b* along all the second scheduled division lines 13*b*. As a result, the first modified layers 23*a* are formed as many as two in a grid pattern at the predetermined first and second heights, respectively, in the first region 11*c* of the wafer 11 along the first scheduled division lines 13*a* and the second scheduled division lines 13*b*.

When forming the first modified layer 23*a* along each second scheduled division line 13*b*, the laser beam 8 is irradiated to the first region 11*c* through the second region 11*d*. If modified layers are already formed in the second region 11*d* at this time, the laser beam 8 may be irradiated to the modified layers and may undergo diffuse scattering (splashing), and may then be irradiated onto at least some of the devices 15 included in the device layer 21. As a consequence, such devices 15 may be damaged potentially. In the above-described first modified layer forming step, on the other hand, the first modified layer 23*a* along each first scheduled division line 13*a* is formed only in the first region 11*c*. Accordingly, upon forming the first modified layer 23*a* along each second scheduled division line 13*b*, no modified layers are yet formed in the second region 11*d* so that the laser beam 8 hardly undergoes diffuse scattering in the second region 11*d*. As a consequence, the laser beam 8 is hardly irradiated onto the devices 15, and therefore damage to the devices 15 is suppressed.

When forming a plurality of first modified layers 23*a* along each of the first scheduled division lines 13*a* and the second scheduled division lines 13*b*, no limitation is imposed on the order in which the first modified layers 23*a* are to be formed. For example, along the first scheduled division lines 13*a*, first modified layers 23*a* may first be formed as many as the like plural number per every first scheduled division line 13*a*, and along the second scheduled division lines 13*b*, first modified layers 23*a* may then be formed as many as the like plural number per every second scheduled division line 13*b*. As an alternative, the first modified layers 23*a* may be successively formed one by one along the first scheduled division lines 13*a* and the second scheduled division lines 13, followed by a repetition of the foregoing step with the focal point of the laser beam 8 set at a height closer to the side of the back surface 11*b*.

FIG. 3B is a cross-sectional view illustrating on the enlarged scale the portion of the wafer 11 after the first modified layer forming step. In the first region 11*c* of the wafer 11, two first modified layers 23*a* are formed in the length direction of each first scheduled division line 13*a* (the left-right direction of the plane of the paper sheet of FIG. 3B) and additional two first modified layers 23*a* are formed in the length direction of each second scheduled division line 13*b* (the front-back direction of the plane of the paper sheet of FIG. 3B). FIG. 3B illustrates an example of the wafer 11, in which along the first scheduled division lines 13a and the second scheduled division lines 13b, the first modified layers 23a are formed as many as two per every scheduled division line.

When the first modified layers 23a are formed, the regions of the wafer 11, in which the first modified layers 23a are included, may expand so that warping may occur in the wafer 11 due to the expansion. If such warping occurs in the wafer 11, the positions of the first scheduled division lines 13a and the second scheduled division lines 13b change, thereby making it difficult to irradiate the laser beam 8 along the first scheduled division lines 13a and the second scheduled division lines 13b. Especially if the first scheduled division lines 13a and the second scheduled division lines 13b are numerous and their intervals are narrow (for example, 5 mm or smaller), the positions of the first scheduled division lines 13a and the second scheduled division lines 13b are prone to large changes by the expansion of the wafer 11. In the first modified layer forming step, it is hence preferred to cause the occurrence of the cracks 25a from the first modified layers 23a to the front surface 11a of the wafer 11 as illustrated in FIG. 3A. Described specifically, upon formation of each lower first modified layer 23a that is closer to the front surface 11a of the wafer 11, the irradiation conditions of the laser beam 8 are set so that cracks 25a are formed extending from the lower first modified layer 23a and reaching the front surface 11a of the wafer 11. When a silicon wafer of 12 inches in diameter and 775 µm in thickness is used as the wafer 11, for example, the focal point of the laser beam 8 is positioned at a point as deep as 200 µm or smaller in terms of the distance (depth) from the front surface 11a of the wafer 11. The laser beam 8 is then irradiated along the first scheduled division lines 13a and the second scheduled division lines 13b. The irradiation conditions of the laser beam 8 may be set, for example, as follows.

Light source: YAG pulse laser
Wavelength: 1,064 nm
Repetition frequency: 60 kHz
Average output: 1.8 W
Processing feed rate: 900 mm/s When the laser beam 8 is irradiated under the above-described conditions, the cracks 25a are continuously formed extending from the lower first modified layer 23a closer to the front surface 11a of the wafer 11 and reaching the front surface 11a of the wafer 11. As a result, the wafer 11 is divided in some regions on the side of the front surface 11a along the corresponding first scheduled division lines 13a and/or the corresponding second scheduled division lines 13b. It has been confirmed that, if the wafer is divided on the side of the front surface 11a as described above, the wafer 11 becomes resistant to the occurrence of warping even when the first modified layers 23a are formed. As a consequence, distortion of the first scheduled division lines 13a and the second scheduled division lines 13b is suppressed, thereby facilitating the irradiation of the laser beam 8 along the first scheduled division lines 13a and the second scheduled division lines 13b. Further, at the time that the first modified layers 23a have been formed, the wafer 11 still remains intact without division on the side of the back surface 11b (the side of the second region 11d). Even if expansion occurs on the side of the front surface 11a (the side of the first region 11c) of the wafer 11 due to the formation of the first modified layers 23a, the wafer 11 therefore hardly undergoes distortion or warping in its entirety so that changes of the positions of the first scheduled division lines 13a and the second scheduled division lines 13b are suppressed.

Figure 4A:
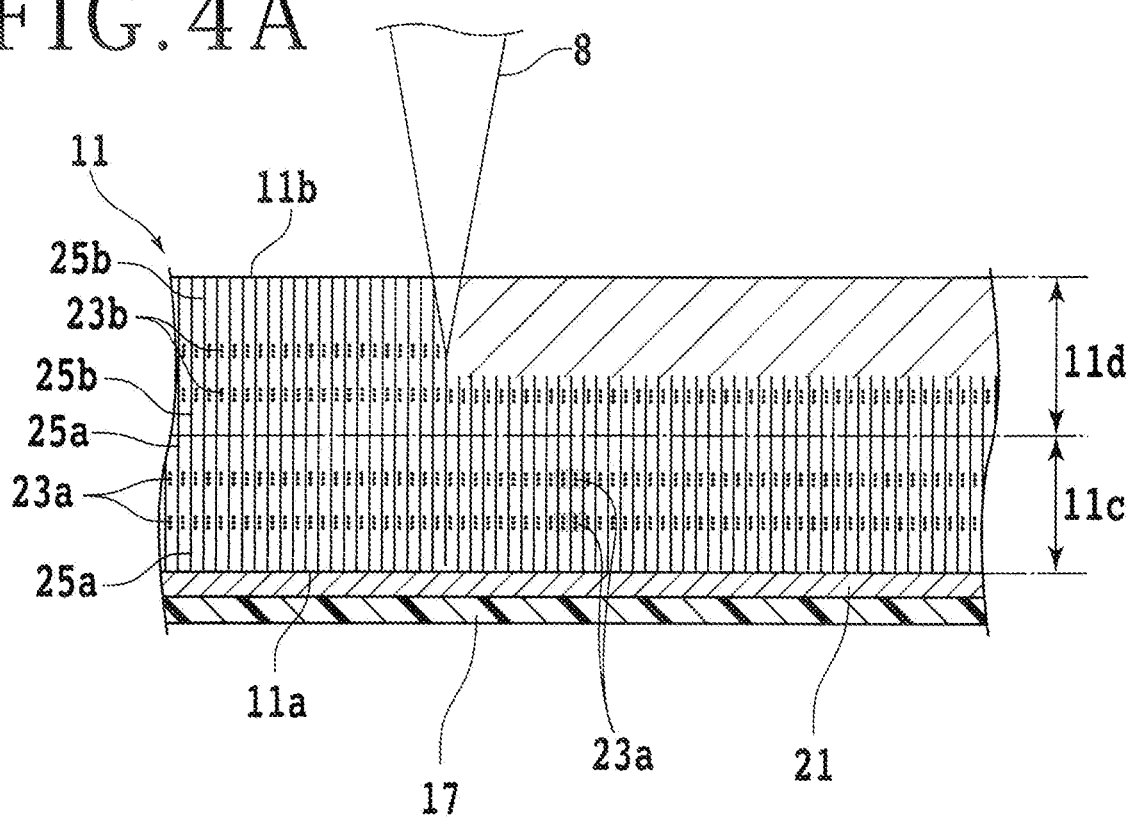
FIG. 4A is a cross-sectional view illustrating on the enlarged scale the portion of the wafer in a second modified layer forming step.

Next, second modified layers (affected layers) 23b are formed in the second region 11d of the wafer 11 along the first scheduled division lines 13a and the second scheduled division lines 13b (second modified layer forming step). FIG. 4A is a cross-sectional view illustrating on the enlarged scale the portion of the wafer 11 in the second modified layer forming step.

In the second modified layer forming step, by similar procedures as in the first modified layer forming step, the laser beam 8 is irradiated along the first scheduled division lines 13a and the second scheduled division lines 13b. Upon irradiating the laser beam 8 onto the wafer 11, however, the height of the focal point of the laser beam 8 is leveled with a predetermined first height in the second region 11d of the wafer 11. As a result, the second modified linear layers 23b, which are located on a lower side as seen in FIG. 4A (hereinafter referred to as "the lower second modified layers 23b"), are formed at the predetermined first height in the second region 11d of the wafer 11 along the first scheduled division lines 13a and the second scheduled division lines 13b, and cracks 25b are also formed from the lower second modified layers 23b along the thickness direction of the wafer 11. The above-described irradiation step is next repeated except that the height of the focal point of the laser beam 8 is brought into alignment with a predetermined second height on a side closer to the back surface 11b than the predetermined first height, in other words, on an upper side as seen in FIG. 4A. As a result, the additional second modified linear layers 23b (hereinafter referred to as "the upper second modified layers 23b") are formed at the predetermined second height in the second region 11d of the wafer 11 along the first scheduled division lines 13a and the second scheduled division lines 13b, and cracks 25b are also formed from the upper second modified layers 23b in the thickness direction of the wafer 11. In the second modified layer forming step, the irradiation conditions of the laser beam 8 are set so that as illustrated in FIG. 4A, cracks 25b are formed extending from the upper second modified layers 23b and reaching the back surface 11b of the wafer 11.

Figure 4B:
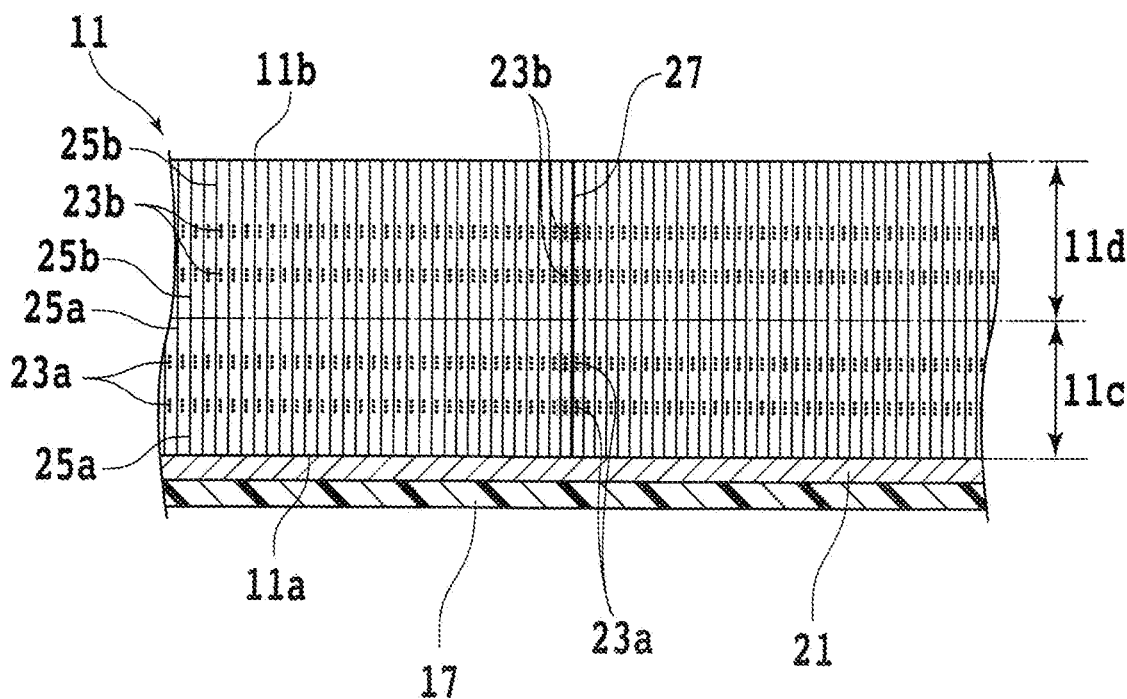
FIG. 4B is a cross-sectional view illustrating on the enlarged scale the portion of the wafer after the second modified layer forming step.

FIG. 4B is a cross-sectional view illustrating on the enlarged scale the portion of the wafer 11 after the second modified layer forming step. FIG. 4B illustrates an example of the wafer 11, in which along the first scheduled division lines 13a and the second scheduled division lines 13b, the second modified layers 23b are formed as many as two per every scheduled division line. Further, the cracks 25b, which propagated from the lower second modified layer 23b (the second modified layer 23b on the side of the front surface 11a) toward the side of the back surface 11b, and the cracks 25b, which propagated from the upper second modified layer 23b (the second modified layer 23b on the side of the back surface 11b) toward the front surface 11a, are connected together. Furthermore, the number of second modified layers 23b to be formed in the second region 11d can be appropriately set like the number of the first modified layers 23a. When forming a plurality of second modified layers 23b along each of the first scheduled division lines 13a and the second scheduled division lines 13b, the order in which the second modified layers 23b are to be formed can be appropriately set as in the first modified layer forming step. In addition, the cracks 25b propagate in a similar fashion as the cracks 25a formed in the first region 11c.

When the second modified layer forming step is conducted, the cracks 25a formed in the first modified layer forming step and the cracks 25b formed in the second modified layer forming step are connected together, whereby a plurality of cracks 27 that extends from the back surface 11b to the front surface 11a of the wafer 11 is continuously formed along the first scheduled division lines 13a and the second scheduled division lines 13b. As a result, the wafer 11 is divided along the first scheduled division lines 13a and the second scheduled division lines 13b, and a plurality of device chips is obtained including the devices 15 (see FIG. 1), respectively.

The cracks 25a formed in the first region 11c through the first modified layer forming step may not have reached the front surface 11a of the wafer 11. If cracks 25b are formed reaching the back surface 11b of the wafer 11 through the second modified layer forming step, however, the cracks 25a propagate to reach the front surface 11a of the wafer 11 while using the formation of the cracks 25b as a trigger. Further, the protective member 17 is already bonded on the side of the front surface 11a of the wafer 11 when the wafer 11 is divided. The layout of the individual device chips is therefore retained by the protective member 17 even after the wafer 11 has been divided into the device chips.

Preferably, the number of the first modified layers 23a to be formed in the first region 11c and the number of the second modified layers 23b to be formed in the second region 11d are adjusted depending on the thickness, material and/or the like of the wafer 11. If the wafer 11 is a silicon wafer of 12 inches in diameter and 775 µm in thickness, for example, it has been confirmed that the wafer 11 can be appropriately divided when the first modified layers 23a are formed as many as two in the first region 11c per every one of the first scheduled division lines 13a and the second scheduled division lines 13b and the second modified layers 23b are formed as many as two in the second region 11d per every one of the first scheduled division lines 13a and the second scheduled division lines 13b. Further, the number of the first modified layers 23a formed in the first region 11c is preferably smaller than the number of the second modified layers 23b formed in the second region 11d. This relationship in number between the first modified layers 23a and the second modified layers 23b has been confirmed to make the wafer 11 more resistant to the occurrence of warping.

Figure 5:
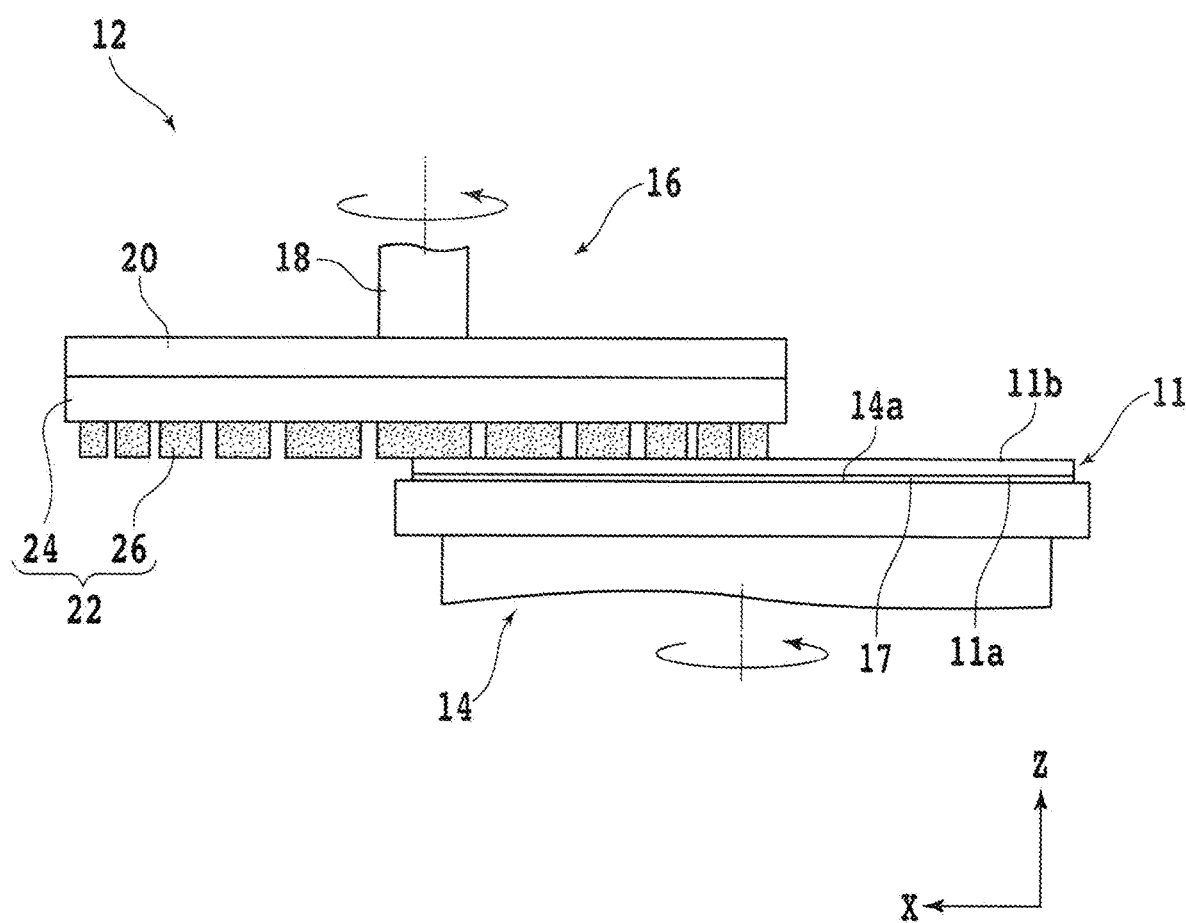
FIG. 5 is a side view depicting a grinding apparatus.

Next, the wafer 11 is ground on the side of the back surface 11b to thin the wafer 11 to a predetermined thickness (grinding step). In the grinding step, the wafer 11 is ground using, for example, a grinding apparatus. FIG. 5 is a side view depicting a grinding apparatus 12.

The grinding apparatus 12 includes a chuck table (holding table) 14 that holds the wafer 11. The chuck table 14 is connected to a rotary drive source (not depicted) such as an electric motor, and this rotary drive source rotates the chuck table 14 about a rotation axis which is substantially parallel to the vertical direction. Further, a moving mechanism (not depicted) is arranged below the chuck table 14, and this moving mechanism moves the chuck table 14 in a processing feed direction. The chuck table 14 has an upper surface, which makes up a holding surface 14a that holds the wafer 11. Corresponding to the shape of the wafer 11, the holding surface 14a is formed in a circular shape. However, the shape of the holding surface 14a can be appropriately changed depending on the shape of the wafer 11 or the like. The holding surface 14a is connected to a suction source (not depicted) via a flow channel (not depicted) formed inside the chuck table 14.

A grinding unit 16 is arranged above the chuck table 14. The grinding unit 16 includes a spindle housing (not illustrated) supported by a lift mechanism (not depicted). A spindle 18 is accommodated in the spindle housing, and a disk-shaped mount 20 is fixed to a lower end portion of the spindle 18. On the side of a lower surface of the mount 20, a grinding wheel 22 of substantially the same diameter as the mount 20 is mounted. The grinding wheel 22 includes an annular bed 24 formed with a metal material such as stainless steel or aluminum. Further, on the side of a lower surface of the bed 24, a plurality of grinding stones 26 formed in a parallelepiped shape are fixedly secured. The grinding stones 26 are aligned in a circle along an outer circumference of the bed 24. A rotary drive source (not illustrated) such as an electric motor is connected to a side of an upper end (a side of a proximal end) of the spindle 18. By a force transmitted from the rotary drive source, the grinding wheel 22 is rotated about a rotation axis that is substantially parallel to the vertical direction. In addition, a grinding fluid supply passage (not depicted) is arranged inside the grinding unit 16 to supply grinding fluid such as pure water. The grinding fluid is supplied toward the wafer 11 and the grinding stones 26 when grinding is applied to the wafer 11.

In a grinding step, the wafer 11 is first placed on the chuck table 14 so that the side of the front surface 11a of the wafer 11 (the side of the protective member 17) and the holding surface 14a face each other. When a negative pressure of the suction source is applied to the holding surface 14a in this state, the wafer 11 is held under suction by the chuck table 14 with the side of the back surface 11b exposed upward. Next, the chuck table 14 is moved and placed under the grinding unit 16. Then, the chuck table 14 and the grinding wheels 22 are both rotated, and the spindle 18 is caused to descend while supplying the grinding fluid to the side of the back surface 11b of the wafer 11. The descending speed of the spindle 18 is adjusted so that the lower surfaces of the grinding stones 26 are pressed under an appropriate force against the side of the back surface 11b of the wafer 11. When the grinding stones 26 come into contact with the side of the back surface 11b of the wafer 11, the wafer 11 is ground on the side of the back surface 11b so that the wafer 11 is thinned. The grinding of the wafer 11 is then continued until the thickness of the wafer 11 is reduced to a predetermined thickness (finish thickness). The finish thickness corresponds to a final thickness of device chips to be obtained by dividing the wafer 11.

Figure 6:
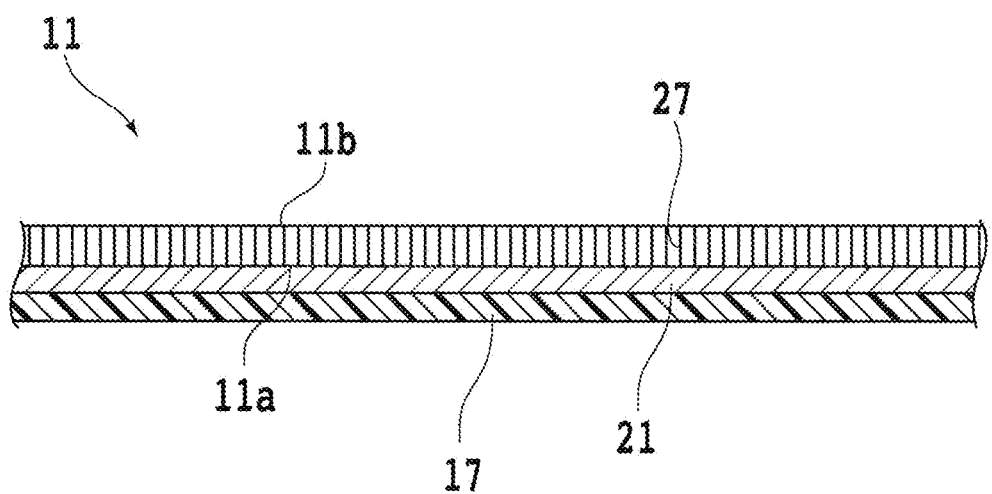
FIG. 6 is a cross-sectional view illustrating on an enlarged scale a portion of the wafer after a grinding step.

FIG. 6 is a cross-sectional view illustrating on an enlarged scale a portion of the wafer 11 after the grinding step. When the grinding step is conducted, the wafer 11 divided along the first scheduled division lines 13a and the second scheduled division lines 13b is thinned to the finish thickness.

If the first modified layers 23a (see FIG. 3A, etc.) remain in the wafer 11 after the grinding, the devices chips obtained by dividing the wafer 11 have a lowered flexural strength. In the above-mentioned first modified layer forming step, it is hence preferred to form the lower first modified layers 23a so that the distance between the front surface 11a of the wafer 11 and the lower first modified layers 23a in the thickness direction of the wafer 11 becomes greater than the finish thickness. In other words, it is preferred not to form the lower first modified layers 23a in a region the distance (depth) of which from the front surface 11a of the wafer 11 is equal to or smaller than the finish thickness. In the case of the above-described preferred manner, the upper and lower first modified layers 23a are all removed if the wafer 11 is ground in the grinding step until the thickness of the wafer 11 is reduced to the finish thickness. As a consequence, the first modified layers 23a no longer remain in the wafer 11 after the grinding, thereby suppressing a reduction in the flexural strength of the device chips.

As has been described above, the wafer processing method according to the present embodiment includes the first modified layer forming step and the second modified layer forming step. In the first modified layer forming step, first modified layers 23a are formed along the first scheduled division lines 13a and the second scheduled division lines 13b. In the second modified layer forming step, second modified layers 23b are formed along the first scheduled division lines 13a and the second scheduled division lines 13b. In the above-described wafer processing method, no modified layers are yet formed in the second region 11d when forming first modified layers 23a along the first scheduled division lines 13a and the second scheduled division lines 13b. Therefore, diffuse scattering (splashing) of the laser beam 8 hardly occurs in the second region 11d when irradiating the laser beam 8 onto the wafer 11 with the focal point of the laser beam 8 positioned in the first region 11c. As a consequence, irradiation of the laser beam 8 onto the devices 15 hardly occurs, and therefore damage to the devices 15 is suppressed.

In the case of use of a method, which divides a wafer by using an expandable sheet after forming modified layers in the wafer, or a method, which divides a wafer by subjecting the wafer to grinding after forming modified layers in the wafer, as in the conventional practice, an external force may not be applied to the whole wafer as intended and the wafer may hence not be divided appropriately. Further, at the time that a step has been conducted to form modified layers in a wafer, it is difficult to confirm whether or not the modified layers have been appropriately formed along scheduled division lines, and therefore it is hard to foresee whether or not the wafer will be appropriately divided in a subsequent step. In the wafer processing method according to the present embodiment, on the other hand, the wafer 11 is divided by using cracks that occur by forming modified layers from the side of the front surface 11a to the side of the back surface 11b of the wafer 11. As a consequence, the wafer 11 is appropriately divided along the first scheduled division lines 13a and the second scheduled division lines 13b. In addition, at the time that the first modified layer forming step and the second modified layer forming step have been conducted, the dividing step of the wafer 11 has already been completed. Before conducting a subsequent step (grinding step or the like), it is hence possible to confirm, with ease, whether or not the wafer 11 has been appropriately divided.

It is to be noted that the structures, procedures and the like according to the above-described embodiment can be practiced with changes and modifications as desired insofar as no departure takes place from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer with devices formed in regions on a side of a front surface of the wafer, the regions being defined by first scheduled division lines and second scheduled division lines that intersect the first scheduled division lines, comprising:
    a protective member bonding step of bonding a protective member on the side of the front surface of the wafer,
    a first modified layer forming step of irradiating a laser beam, the laser beam having transmissivity through the wafer, from a side of a back surface of the wafer along the first scheduled division lines and the second scheduled division lines with a focal point of the laser beam being set at at least one height leveled within a height of a first region located inside the wafer, the wafer being held by a chuck table via the protective member, on the side of the front surface of the wafer, whereby first modified layers are formed in the first region without the laser beam cutting through the back surface of the wafer,
    a second modified layer forming step of, after conducting the first modified layer forming step, irradiating the laser beam from the side of the back surface of the wafer along the first scheduled division lines and the second scheduled division lines with the focal point of the laser beam being set at at least one height leveled within a height of a second region located inside the wafer on the side of the back surface of the wafer, whereby second modified layers are formed in the second region without the laser beam cutting through the back surface of the wafer and cracks are also formed extending from the front surface to the back surface of the wafer to divide the wafer along the first scheduled division lines and the second scheduled division lines, and
    a grinding step of, after conducting the second modified layer forming step, grinding the wafer on the side of the back surface of the wafer to thin the wafer to a predetermined thickness.

2. The wafer processing method according to claim 1, wherein, in the first modified layer forming step, cracks are formed extending from the first modified layers to the front surface of the wafer.

3. The wafer processing method according to claim 1, wherein,
    in the first modified layer forming step, the first modified layers are formed so that a distance from the front surface of the wafer to the first modified layers is greater than the predetermined thickness to which the wafer is ground in the grinding step, and,
    the first modified layers are removed when the wafer is ground to the predetermined thickness.

4. The wafer processing method according to claim 1, wherein the focal point of the laser beam in the first modified layer forming step is set at a plurality of heights leveled within the height of the first region located inside the wafer, and
    the focal point of the laser beam in the second modified layer forming step is set at a plurality of heights leveled within the height of the second region located inside the wafer.

5. The wafer processing method according to claim 1, wherein the second region is located on top of the first region on the side of the back surface and the first region is located on the side of the front surface of the wafer.

6. The wafer processing method according to claim 2, wherein in the second modified layer forming step, cracks are formed extending from the second modified layers to the back surface.

7. The wafer processing method according to claim 6, wherein when the second modified layer forming step is conducted, the cracks that formed in in the second modified layer forming step and the cracks that formed in the first modified layer forming step are connected together to form continuous cracks extending from the front surface to the back surface of the wafer.

* * * * *